(12) United States Patent
Kasperchik et al.

(10) Patent No.: US 8,293,450 B2
(45) Date of Patent: Oct. 23, 2012

(54) LASER IMAGING COATING AND METHODS FOR IMAGING

(75) Inventors: Vladek Kasperchik, Corvallis, OR (US); Susan E. Bailey, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1302 days.

(21) Appl. No.: 11/606,265

(22) Filed: Nov. 28, 2006

(65) Prior Publication Data

US 2008/0124655 A1    May 29, 2008

(51) Int. Cl.
*G03C 1/00* (2006.01)
*G03F 7/00* (2006.01)
*G03F 1/00* (2006.01)

(52) U.S. Cl. ............... 430/270.1; 430/270.11

(58) Field of Classification Search ............ 106/31.19; 430/270.1
See application file for complete search history.

(56) References Cited

U.S. PATENT DOCUMENTS

| | | | |
|---|---|---|---|
| 4,839,335 A * | 6/1989 | Ellis ............................ 503/224 |
| 6,291,045 B1 | 9/2001 | Tajima et al. |
| 6,800,347 B2 | 10/2004 | Ishida et al. |
| 2003/0108708 A1 * | 6/2003 | Anderson et al. ............ 428/64.4 |
| 2004/0209034 A1 * | 10/2004 | Tompson et al. ............. 428/64.4 |
| 2004/0245432 A1 * | 12/2004 | Takizawa ................... 250/208.1 |
| 2005/0089782 A1 * | 4/2005 | Kasperchik et al. ............ 430/66 |
| 2005/0100817 A1 * | 5/2005 | Kasperchik et al. ........ 430/270.1 |
| 2007/0065623 A1 * | 3/2007 | Kasperchik et al. ......... 428/64.4 |

OTHER PUBLICATIONS www.organica.com, functional dyes, 2002.*
International Search Report issued Jun. 10, 2008, for International Patent Application No. PCT/US2007/085490.

* cited by examiner

*Primary Examiner* — Cynthia Kelly
*Assistant Examiner* — Connie P Johnson

(57) ABSTRACT

Briefly described, embodiments of this disclosure include, coating layers image recording media, and methods for forming an image.

9 Claims, 1 Drawing Sheet

LASER IMAGING COATING AND METHODS FOR IMAGING

BACKGROUND

Many laser imageable coatings typically include a dye and a developer, where each is disposed in a separate phase. The color is developed through a reaction between the dye and the developer upon melting of the coating and mixing of the phases. For example, a colorless or nearly colorless fluoran leuco-dye can react with an acidic developer. Proton transfer from the developer opens the lactone ring of the leuco-dye resulting in extension of the conjugate double bond system and color formation. These coatings are complex chemical systems. They may provide a good marking contrast and sensitivity but have some deficiencies such as:

a) The process of coating preparation may be quite labor-intensive. Color-forming components (leucodyes, for example) should be present in the coating formulation as finely dispersed phase (=<1 um). Particle size reduction of the color-former is an additional process.

b) To enable better sensitivity, the color-former phase in described above formulations should be sensitized with laser radiation absorber—usually through alloying it with leuco-dye. Preparation of the alloys of leuco-dyes and radiation absorbers is an additional process.

c) In order to enable high marking contrast, the content of the dispersed phase in the described above formulations is very high (15-40 wt. %). As a result, the viscosity of the inks is also very high (typically in the range 100-5000 poise). The high viscosity of the inks limits the types of methods that can be used for their application to a substrate.

Therefore, there is a need in the art for laser imageable coatings that overcome one or more of these disadvantages.

SUMMARY

Briefly described, embodiments of this disclosure include, coating layers image recording media, and methods for forming an image. One exemplary embodiment of the coating layer, among others, includes a polymer matrix; and a labeling dye, wherein the labeling dye absorbs electromagnetic radiation in the visible range of about 400-700 nm to provide visible coloration, wherein the labeling dye has a characteristic to form a reaction product upon exposure to radiation energy at a wavelength of about 400-900 nm, and wherein the product has a color different than the labeling dye or is colorless.

One exemplary embodiment of the recording medium, among others, includes a coating layer as described above.

One exemplary embodiment of the method for forming an image, among others, includes disposing a coating layer onto a substrate, wherein the coating layer includes: a matrix and a labeling dye; and exposing a portion of the coating layer to a radiation energy of about 400-900 nm to form the image, wherein the labeling dye exposed to the radiation energy forms a product, and wherein the product has a color different than the labeling dye or is colorless. The labeling dye forms a reaction product upon exposure to radiation energy at a wavelength of about 400-900 nanometers (nm) and changes radiation energy absorption in visible range of about 400-700 nm.

BRIEF DESCRIPTION OF THE DRAWINGS

Many aspects of this disclosure can be better understood with reference to the following drawings. The components in the drawings are not necessarily to scale. Moreover, in the drawings, like reference numerals designate corresponding parts throughout the several views.

FIG. 1 illustrates a disk having marks produced in accordance with embodiments of the present disclosure.

DETAILED DESCRIPTION

Embodiments of the present disclosure will employ, unless otherwise indicated, techniques of synthetic organic chemistry, ink chemistry, media chemistry, printing chemistry, and the like, that are within the skill of the art. Such techniques are explained fully in the literature.

In the following description, for purposes of explanation, numerous specific details are set forth in order to provide a thorough understanding of the present disclosure. It will be apparent, however, to one skilled in the art to which the present disclosure relates, that the disclosed composition and systems and methods may be practiced without these specific details. Reference in the specification to "an embodiment" means that a particular feature, structure, or characteristic described in connection with the embodiment is included in at least one embodiment.

The following examples are put forth so as to provide those of ordinary skill in the art with a complete disclosure and description of how to perform the methods and use the compositions disclosed and claimed herein. Efforts have been made to ensure accuracy with respect to numbers (e.g., amounts, temperature, pressure, and the like) but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It should be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Embodiments of the disclosure include coating layers and methods of using the coating layers. The coating layer includes a matrix material (hereinafter "matrix") having a labeling dye uniformly dissolved and dispersed in the matrix, where the labeling dye has a visible color. Radiation energy can be directed image-wise at the coating layer, and on portions of the coating layer that the radiation energy impacts, the labeling dye undergoes a transformation (e.g., photochemical and/or thermal decomposition or degradation) to produce high contrast images. The products of the transformation do not have a visible color or have a color different from that of the original labeling dye. In other words, the image is formed by a subtractive imaging technique, where the labeling dye is removed and the remaining labeling dye forms or outlines the image. The coating layer can be disposed onto a substrate and used in structures such as, but not limited to, paper media, digital recording media, and the like.

The coating layer of the present disclosure is advantageous because (for example) the coating layer, methods of making the coating layer, and the methods of forming an image, are very simple. Another advantage (for example) is that a solid phase is not dispersed in the coating layer, thereby allowing a wide range of viscosities to be used. In this regard, applications that use spin-coating (e.g., in the optical storage media industry) to coat substrates can use coating layers of the present disclosure. Yet another advantage (for example) is that the image formation is irreversible due to the decomposition or degradation of the labeling dye, unlike images formed using proton transfer, which is reversible. As a result, images formed using coating layers of the present disclosure can provide images with better long-term performance (stability).

The coating layer(s) can be disposed on a substrate to form an imaging medium. The substrate may be a substrate upon which it is desirable to make a mark, such as, but not limited to, paper media (e.g., labels, tickets, receipts, or stationary), overhead transparencies, a metal/metal composite, glass, a ceramic, a polymer, digital audio media (e.g., a compact disk (CD) (e.g., CD-R/RW/ROM), and digital video media (DVD) (e.g., DVD-R/RW/ROM).

As mentioned above, the coating layer includes, but is not limited to, a matrix and a labeling dye. The coating layer may be applied to the substrate via any acceptable method, such as, but not limited to, spin-coating, rolling, spraying, and screen-printing. In addition, one or more layers can be formed between the coating layer and the substrate, and/or one or more layers can be formed on top of the coating layer. In one embodiment, the coating layer is part of a CD or a DVD.

To form a mark, radiation energy is directed image-wise at one or more discrete areas of the coating layer of the imaging medium. The form of radiation energy may vary depending upon the equipment available, ambient conditions, the desired result, and the like. The radiation energy can include, but is not limited to, visible, infrared (IR) and ultraviolet (UV) radiation. The labeling dye absorbs the radiation energy and is photochemically and/or thermally decomposed or degraded. Thus, the labeling dye is transformed into products that have no color or have a color different than that of the unexposed labeling dye. As a result, an image is formed or outlined by the remaining unexposed labeling dye in the coating layer.

The matrix can be a radiation curable polymer matrix or a solvent-based polymer matrix. The radiation curable polymer can include a UV-curable polymer (e.g., a mixture of monofunctional and/or polyfunctional monomore and/or oligomers).

The monomers can include, but are not limited to, 1,6-hexanediol diacrylate, isobornyl methacrylate, isobornyl acrylate, dicyclopentadienyl acrylate, dicyclopentadienyl methacrylate, tripropylene glycol diacrylate, cyclohexyl (meth)acrylate, cyclohexyl acrylate, cyclohexyl(meth)acrylate, dicyclopentanyl(meth)acrylate, methyl methacrylate, tert-butyl acrylate, tert-butyl methacrylate, dicyclopentanyloxyethyl(meth)acrylate, dicyclopentenyloxyethyl(meth)acrylate, 4-tert-butylstyrene, other styrene derivatives, and the like.

The oligomers can include, but are not limited to, ethoxylated bis-phenol-A diacrylates and other epoxy acrylates, urethane acrylates, polyethylene glycol diacrylates, polypropylene glycol diacrylates, polyester acrylates, and so on. By adjusting the ratio of the lower viscosity monomers and the higher viscosity oligomers in the mix, the final viscosity can be fine tuned for the coating formulation.

In an embodiment the matrix is used in combination with a photoinitiator (so-called "photo package"). A photo package may include, but is not limited to, a light absorbing species, which initiates reactions for curing of a matrix such as, by way of example, benzophenone derivatives. Other examples of photoinitiators for free radical polymerization monomers and pre-polymers include, but are not limited to, thioxanethone derivatives, anthraquinone derivatives, acetophenones and benzoine ether types, and the like.

A polymer matrix can also be made from a solvent-based polymer (e.g., a solvent solubized or dispersed polymer). Examples of solvent solubilized polymer include, but are not limited to, polyurethane, polyesters, and polyvinylalcohol. Ethyl acetate, hexane, ethanol and water are examples of solvents used to solubilize or disperse. The solvent-based polymer is coated on to the substrate, and the solvent is removed to form the final film. Typical methods of solvent removal include evaporation during spin-coating of the polymer onto the substrate or drying the solvent in a low temperature oven or with a fan subsequent to coating.

The matrix compound is from about 2 weight percent (wt %) to 98 wt % of the coating and from about 20 wt % to 99.5 wt % of the coating layer.

The term "labeling dye" refers to a color forming substance, which has a color that can be changed through decomposition and/or degradation. The product(s) of the decomposition or degradation have a different color than the labeling dye or is colorless.

The labeling dye has a high rate of decomposition and/or degradation at or in the vicinity of wavelength of the imaging laser. It also has visible coloration responsible for background color of the coating layer. Upon irradiation with the imaging laser, molecules of the labeling dye absorb the energy and undergo transformation (e.g., photochemical and/or thermal decomposition or degradation). Optical contrast between the original background color and areas where labeling dye was transformed by the laser radiation results in visible marks and, thus, enables imaging.

In an embodiment, the labeling dyes absorb in visible range of about 400-700 nm and is significant enough to provide visible coloration (e.g., visible to the human eye). In an embodiment, the labeling dyes have a strong extinction peak in the wavelength of about 400-900 nm or about 400-800 nm. As mentioned above, the labeling dye can be decomposed photochemically (at high radiation densities) or capable of fast thermal decomposition.

In an embodiment, it may be advantageous for the labeling dye to have a counterion capable of being a strong oxidizer, for example perchlorate anion ($ClO_4^-$). The labeling dye should be soluble in the matrix ($\geq 0.5$ wt. %).

The labeling dye can include, but is not limited to, cyanine, oxazine, oxonol dyes. The labeling dyes include, but are not limited to, 1,1'-dibutyl-3,3,3',3'-tetramethylindadicarbocyanine hexafluorophosphate (sold by "Organica Feinchemie Gmbh Wolfen" as Dye 783; extinction max.—643 nm):

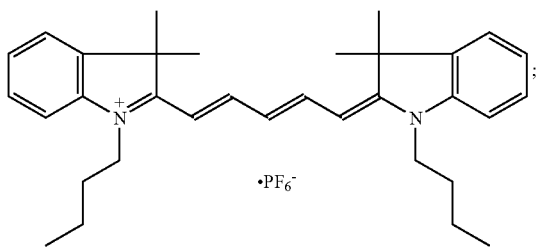

4,5:4',5'-dibenzo-1,1',3,3,3',3'-hexamethylindadicarbocyanine perchlorate (sold by "Organica Feinchemie Gmbh Wolfen" as Dye 391; extinction max.—675 nm):

a.

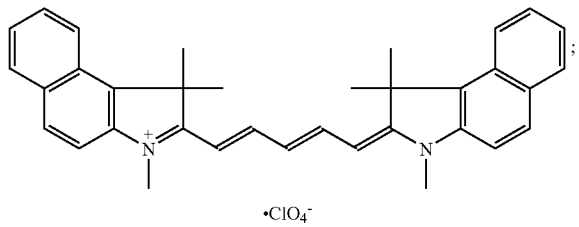

1H-benz[e]indolium, 2-[7-[1,3-dihydro-1,1-dimethyl-3-(4-sulfobutyl)-2H benz[e]indol-2-ylidene]-1,3,5-heptatrienyl]-1,1-dimethyl-3-(4-sulfobutyl)-, inner salt, sodium salt (sold by "FEW Chemicals" as S0270, also known as Indocyanine Green, extinction max. ~780 nm):

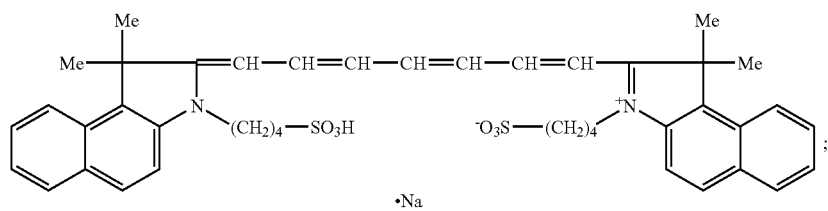

3,7-bis(diethylamino)phenoxazinium perchlorate (sold by "Organica Feinchemie Gmbh Wolfen" as Oxazine 725; extinction max.—645 nm):

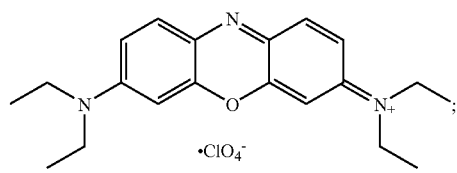

4,5-benzo-1,1'-dibutyl.3,3,3',3',5'-pentamethylindacarbocyanine perchlorate (sold by "Organica Feinchemie Gmbh Wolfen" as Dye 785; extinction max.—573 nm):

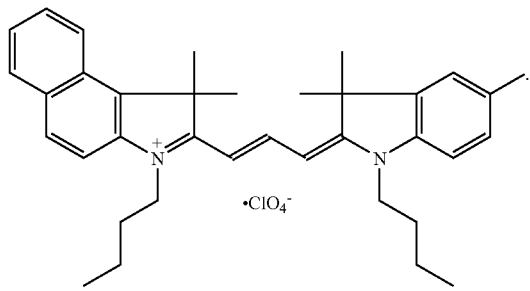

The labeling dye content in the coating is from about 0.5 wt % to 90 wt % of the coating layer preferably from 1 wt. % to 50 wt. % of the coating layer, and most preferably from 1 wt. % to 20 wt. of the coating layer.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual. concentrations (e.g., 1%, 2%, 3%, and 4%) and the sub-ranges (e.g., 0.5%, 1.1%, 2.2%, 3.3%, and 4.4%) within the indicated range.

While embodiments of the present disclosure are described in connection with Examples 1-2 and the corresponding text and figures, there is no intent to limit the disclosure to the embodiments in these descriptions. On the contrary, the intent is to cover all alternatives, modifications, and equivalents included within the spirit and scope of embodiments of the present disclosure.

EXAMPLE 1

Organica 783 dye and Irgacure-1300 were dissolved in mixture of monomers and oligomer. The coating formulation was spin-coated onto CD surface (5000 rpm) and cured with UV microwave H-bulb. The resulting coating thickness on the disk was in the range 4-4.5 μm. The coating was imaged with 650 nm laser (Power=45-65 mW; beam linear velocity in the range 50-400 mm/sec). Background color of the coating was deep blue (a grayish color (12) as shown in FIG. 1), while laser marks were greenish-yellow (a lighter gray (14) as shown in FIG. 1) in color. Table 1 shows the exemplary formulation.

TABLE 1

| | %, wt. |
|---|---|
| SR238 (1,6-hexanediol diacrylate) | 56.12% |
| Ebecryl 605 (epoxyacylate oligomer) | 26.44% |
| SR306HP (tripropyleneglycol diacrylate) | 8.94% |
| Organica Dye 783 | 2.50% |
| Irgacure-1300 (photoinitiator) | 6.00% |
| Total | 100.00% |

EXAMPLE 2

Organica 783 dye was dissolved into the polyurethane solution (RezU 379). The coating formulation was spin-coated onto CD surface (2500 rpm) and allowed to dry under ambient conditions. The resulting coating thickness on the disk was in the range <2 μm. Coating was imaged with 650 nm laser (Power=45-65 mW; beam linear velocity in the range 50-200 mm/sec). The background color of the coating was deep blue while laser marks were greenish-yellow in color. Table 2 shows the exemplary formulation.

TABLE 2

|  | %, wt. |
| --- | --- |
| RezU 379 (ethylacetate dissolved polyurethane) | 98.75% |
| Organica Dye 783 | 1.25% |
| Total | 100.00% |

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A coating layer comprising:
a polymer matrix, wherein matrix is a UV-curable matrix selected from UV-curable monomers, UV-curable oligomers, and mixtures thereof, and a photoinitiator; and
a labeling dye, wherein the labeling dye absorbs electromagnetic radiation in the visible range of about 400-700 nm to provide visible coloration, wherein the labeling dye has a characteristic to form a reaction product upon exposure to radiation energy at a wavelength of about 400-900 nm, wherein the product has a color different than the labeling dye or is colorless, and wherein the coating layer does not include a solid phase;
wherein the labeling dye is selected from: 1,1'-dibutyl-3,3,3',3'-tetramethylindadicarbocyanine hexafluorophosphate, 4,5:4',5'-dibenzo-1,1',3,3,3',3'-hexamethylindadicarbocyanine perchlorate, 1H-benzindolium, 2-[7-[1,3-dihydro-1,1-dimethyl-3-(4-sulfobutyl)-2H benzindol-2-ylidene]-1,3,5-heptatrienyl]-1,1-dimethyl-3-(4-sulfobutyl)-, inner salt, 3,7-bis(diethylamino)phenoxazinium perchlorate, 4,5-benzo-1,1'-dibutyl-3,3,3',3',5'-pentamethylindacarbocyanine perchlorate, and combinations thereof.

2. An image recording medium comprising:
a substrate having a coating layer disposed thereon, wherein the coating layer includes:
a polymer matrix, wherein the polymer matrix is about 20 wt % to 99.5 wt % of the coating layer,
a labeling dye, wherein the labeling dye absorbs electromagnetic radiation in the visible range of about 400-700 nm to provide visible coloration and wherein the labeling dye is about 1 wt % to 20 wt % of the coating layer, and
a product that has a color different than the labeling dye or is colorless.

3. The image recording medium of claim 2, wherein the substrate is selected from a paper medium, a transparency, a compact disk (CD), and a digital video disk (DVD).

4. The image recording medium of claim 2, wherein the substrate is selected from a CD-R/RW/ROM and DVD-R/RW/ROM.

5. The image recording medium of claim 2, wherein the labeling dye is selected from: 1,1'-dibutyl-3,3,3',3'-tetramethylindadicarbocyanine hexafluorophosphate, 4,5:4',5'-dibenzo-1,1',3,3,3',3'-hexamethylindadicarbocyanine perchlorate, 1H-benzindolium, 2-[7-[1,3-dihydro-1,1-dimethyl-3-(4-sulfobutyl)-2H benzindol-2-ylidene]-1,3,5-heptatrienyl]-1,1-dimethyl-3-(4-sulfobutyl)-, inner salt, 3,7-bis(diethylamino)phenoxazinium perchlorate, 4,5-benzo-1,1'-dibutyl-3,3,3',3',5'-pentamethylindacarbocyanine perchlorate, and combinations thereof.

6. The image recording medium of claim 2, wherein the polymer matrix is about 20 wt % to 99.5 wt % of coating layer and wherein the labeling dye is about 1 wt % to 20 wt % of coating layer.

7. A method for forming an image, the method comprising:
disposing a coating layer onto a substrate, wherein the coating layer includes:
a matrix, wherein matrix is a UV-curable matrix selected from UV-curable monomers, UV-curable oligomers, and mixtures thereof, and a photoinitiator, and
a labeling dye, wherein the labeling dye absorbs radiation energy in visible range of about 400-700 nm;
exposing a portion of the coating layer to a radiation energy of about 400-900 nm to form the image, wherein the labeling dye exposed to the radiation energy forms a product, and wherein the product has a color different than the labeling dye or is colorless; and
forming an image by decomposition or degradation of the labeling dye, such that the image has increased stability over images formed by reversible mechanisms.

8. The method of claim 7, wherein the substrate is selected from a paper media, a transparency, a compact disk (CD), and a digital video disk (DVD).

9. The method of claim 7, wherein the labeling dye is selected from: 1,1'-dibutyl-3,3,3',3'-tetramethylindadicarbocyanine hexafluorophosphate, 4,5:4',5'-dibenzo-1,1',3,3,3',3'-hexamethylindadicarbocyanine perchlorate, 1H-benzindolium, 2-[7-[1,3-dihydro-1,1-dimethyl-3-(4-sulfobutyl)-2H benzindol-2-ylidene]-1,3,5-heptatrienyl]-1,1-dimethyl-3-(4-sulfobutyl)-, inner salt, 3,7-bis(diethylamino)phenoxazinium perchlorate, 4,5-benzo-1,1'-dibutyl-3,3,3',3',5'-pentamethylindacarbocyanine perchlorate, and combinations thereof.

* * * * *